(12) United States Patent
Bae et al.

(10) Patent No.: US 7,518,147 B2
(45) Date of Patent: Apr. 14, 2009

(54) ORGANIC ELECTRO LUMINESCENCE DEVICE AND FABRICATION METHOD THEREOF

(75) Inventors: Sung Joon Bae, Seongnam-si (KR); Jae Yoon Lee, Seoul (KR)

(73) Assignee: LG. Display Co., Ltd., Seoul (KR)

( * ) Notice: Subject to any disclaimer, the term of this patent is extended or adjusted under 35 U.S.C. 154(b) by 0 days.

(21) Appl. No.: 11/126,734

(22) Filed: May 10, 2005

(65) Prior Publication Data

US 2005/0247936 A1 Nov. 10, 2005

(30) Foreign Application Priority Data

May 10, 2004 (KR) ................ 10-2004-0032578

(51) Int. Cl.
*H01L 31/036* (2006.01)
(52) U.S. Cl. .................. 257/72; 257/40; 257/59; 257/347; 257/E21.111; 257/E51.019
(58) Field of Classification Search ............ 257/59, 257/72, 40, 347
See application file for complete search history.

(56) References Cited

U.S. PATENT DOCUMENTS

| | | | |
|---|---|---|---|
| 6,548,961 B2 | 4/2003 | Barth et al. | |
| 6,608,449 B2 | 8/2003 | Fukunaga | |
| 6,831,298 B2 | 12/2004 | Park et al. | |
| 2002/0195961 A1 | 12/2002 | Barth et al. | |
| 2003/0201445 A1* | 10/2003 | Park et al. | 257/79 |
| 2003/0205763 A1 | 11/2003 | Park et al. | |
| 2004/0004432 A1* | 1/2004 | Park et al. | 313/504 |
| 2004/0014251 A1 | 1/2004 | Park et al. | |
| 2004/0017151 A1* | 1/2004 | Kim et al. | 313/504 |
| 2004/0069986 A1* | 4/2004 | Park et al. | 257/40 |
| 2004/0080262 A1 | 4/2004 | Park et al. | |
| 2004/0100191 A1* | 5/2004 | Park | 313/506 |
| 2004/0227459 A1* | 11/2004 | Imura | 313/504 |

(Continued)

FOREIGN PATENT DOCUMENTS

CN 1477912 2/2004

(Continued)

OTHER PUBLICATIONS

Search report dated Apr. 7, 2006 for corresponding French Application No. 0504665000.

(Continued)

*Primary Examiner*—A. Sefer
(74) *Attorney, Agent, or Firm*—Brinks Hofer Gilson & Lione

(57) ABSTRACT

An organic electro luminescence device is provided. In the organic electro luminescence device, first and second electrodes are arranged to face each other and to be spaced apart from each other by a predetermined interval, and includes sub-pixels for reproducing an image. An array element is formed in the first substrate per sub-pixel, and includes at least one TFT. An organic electro luminescent diode is formed in the second substrate per sub-pixel. A spacer covered with a metal portion for electrically connecting the first and second substrates. A drain electrode of the TFT and a first electrode (anode) of the organic electro luminescent diode are electrically connected by the spacer covered with the metal portion.

20 Claims, 6 Drawing Sheets

U.S. PATENT DOCUMENTS

2005/0012105 A1    1/2005  Yamazaki et al.
2005/0140285 A1    6/2005  Park et al.
2005/0140287 A1*   6/2005  Ko .............................. 313/506

FOREIGN PATENT DOCUMENTS

| FR | 2 864 705 | | 7/2005 |
|---|---|---|---|
| JP | 2002-278477 | * | 9/2002 |
| KR | 2004-8322 | | 1/2004 |

OTHER PUBLICATIONS

Search Report dated Jan. 31, 2007 for corresponding Great Britain Patent Application No. 0624553.4.

First Office Action issued in corresponding Chinese Patent Application No. 2005100694545 issued Jan. 18, 2008.

* cited by examiner

ORGANIC ELECTRO LUMINESCENCE DEVICE AND FABRICATION METHOD THEREOF

PRIORITY CLAIM

This application claims the benefit of Korean Patent Application No. P2004-32578 filed on May 10, 2004, which is hereby incorporated by reference.

FIELD OF THE INVENTION

The present invention relates to an organic electro luminescence device and a fabrication method thereof, and more particularly, to an organic electro luminescence device using a poly-silicon (p-Si) TFT as a driving element and a fabrication method thereof.

DESCRIPTION OF THE RELATED ART

In the fields of flat panel display devices, a liquid crystal display device (LCD) is widely used because it is lightweight and has low power consumption. However, the LCD is a non-luminous display device and has technical limitations in brightness, contrast, viewing angle, and screen size. Therefore, new flat panel display devices capable of overcoming these drawbacks have been developed actively.

One of the new flat panel display devices is an organic electro luminescence device (OELD). Since the OELD is a self-luminous display device, it has a high contrast and wide viewing angle compared with the LCD. Also, since the OELD does not require a backlight assembly, it is lightweight and slim. In addition, the OELD can reduce power consumption.

Further, the OELD can be driven at a low DC voltage and has a fast response speed. Since all components of the OELD are formed of solid material, it is endurable against external impact. It can also be used in a wide temperature range and can be manufactured at a low cost.

Specifically, the OELD is easily fabricated through a deposition process and an encapsulation process. Therefore, the fabrication method and apparatus for the OELD are simpler than those of an LCD or PDP.

If the OELD is driven in an active matrix type, uniform brightness can be obtained even when a low current is applied. Accordingly, the OELD has advantages of low power consumption, high definition and large-sized screen.

A basic structure and operation characteristic of an active matrix type OLED (AMOLED) will now be described with reference to the accompanying drawing.

FIG. 1 is a circuit diagram illustrating a basic pixel structure of a related art AMOLED.

Referring to FIG. 1, gate lines (GL) 2 are formed in a first direction and data lines (DL) 3 and power lines (VDD) 4 are formed in a second direction intersecting the first direction to define each sub-pixel region.

A switching TFT 5 serving as an addressing element is formed on each intersection of the gate and data lines 2 and 3. A storage capacitor ($C_{ST}$) 6 is connected to the switching TFT 5 and the power line 4. A driving TFT 7 serving as a current source element is connected to the storage capacitor ($C_{ST}$) 6 and the power line 4. An organic electro luminescent diode 8 is connected to the driving TFT 7.

When a forward current is applied to the organic light emitting material, electrons and holes are recombined, moving through a P-N junction between an anode electrode as a hole donor and a cathode electrode as an electron donor. Therefore, the energy of the organic electro luminescent diode 8 becomes lower than that created when the electrons are separated from the holes. At this point, light is emitted due to the energy difference.

That is, each sub-pixel of the AMOLED includes the switching TFT 5 and the driving TFT 7. The switching TFT 5 addresses a pixel voltage that is a gate driving voltage, and the driving TFT 7 controls a driving current of the AMOLED. Also, the storage capacitor 6 for maintaining the pixel voltage stably is present.

The OELD may be classified into a top emission type and a bottom emission type depending on a traveling direction of the light emitted from the organic electro luminescent diode.

The TFT used in the AMOLED is classified into an amorphous silicon (a-Si) TFT and a polysilicon (p-Si) TFT depending on states of a semiconductor thin film serving as an active channel. In recent years, much effort has been expended to apply a p-Si TFT having high field effect mobility to the AMOLED.

FIG. 1 is a circuit diagram of an AMOLED using a p-Si TFT. As shown in FIG. 1, since the TFT is a p-type TFT, an anode of the organic electro luminescent diode is connected to a drain electrode D of the driving TFT 7 and the power line 4 is connected to a source electrode S of the driving TFT 7.

FIG. 2 is a schematic sectional view of a related art bottom emission type AMOLED. As shown in FIG. 2, first and second substrates 10 and 30 are arranged to face each other. Edge portions of the first and second substrates 10 and 30 are encapsulated by a seal pattern 40. A TFT T is formed on a transparent substrate 1 of the first substrate 10 in sub-pixel unit. A first electrode 12 is connected to the TFT T. An organic electro luminescent layer 14 is formed on the TFT T and the first electrode 12 and is arranged corresponding to the first electrode 12. The organic electro luminescent layer 14 contains light emission materials taking on red, green and blue colors. A second electrode 16 is formed on the organic electro luminescent layer 14.

The first and second electrodes 12 and 16 function to apply an electric field to the organic electro luminescent layer 14.

Due to the seal pattern 40, the second electrode 16 and the second substrate 30 are spaced apart from each other by a predetermined distance. Therefore, an absorbent (not shown) and a translucent tape (not shown) may be further provided in an inner surface of the second substrate 30. The absorbent absorbs moisture introduced from outside the AMOLED, and the translucent tape adheres the absorbent to the second substrate 30.

In the bottom emission type structure, when the first electrode 12 and the second electrode 16 are respectively an anode and a cathode, the first electrode 12 is formed of a transparent conductive material and the second electrode 16 is formed of a metal having a low work function. In such a condition, the organic electro luminescent layer 14 includes a hole injection layer 14a, a hole transporting layer 14b, an emission layer 14c, and an electron transporting layer 14d, which are sequentially formed on a layer contacting with the first electrode 12. The emission layer 14c has red, green and blue color filters in sub-pixels.

FIG. 3 is an enlarged sectional view of one sub-pixel region of the bottom emission type OELD shown in FIG. 2. As shown in FIG. 3, a p-Si TFT region includes a semiconductor layer 62, a gate electrode 68, and source/drain electrodes 80 and 82 that are sequentially formed on a transparent substrate 1. The source/drain electrodes 80 and 82 are connected respectively to a power electrode 72 and an organic electro luminescent diode E that are formed in a power line (not shown).

A storage capacitor region includes the power electrode 72, a capacitor electrode 64 disposed under the power electrode 72, and a dielectric interposed between the power electrode 72 and the capacitor electrode 64.

Elements other than the organic electro luminescent diode E, which are formed in the p-Si TFT region and the storage capacitor region, constitute an array element A.

The organic electro luminescent diode E includes a first electrode 12, a second electrode 16 facing the first electrode 12, and an organic electro luminescent layer 14 interposed between the first and second electrodes 12 and 16. The organic electro luminescent diode E is positioned in an emission region that emits its self-luminous light outside.

As illustrated in FIG. 1, the first electrode 12 electrically connected to the drain electrode 82 is an anode made of an indium tin oxide (ITO), and the second electrode 16 is a cathode formed of metal such as Al (aluminum) having a low work function. In the related art OELD, the array element A and the organic electro luminescent diode E are stacked on the same substrate.

However, in the bottom emission type OELD, a current compensation circuit is used to solve the current non-uniformity of the array element having the p-Si TFT, and thus four TFTs are provided in one pixel. For this reason, it is difficult to secure a sufficient aperture ratio for a small-sized display device.

Also, the bottom emission type OELD is fabricated by attaching the substrate where the array element and the organic electro luminescent diode are formed to the separate substrate provided for the encapsulation. In this case, the yield of the OELD is determined by the product of the yield of the array element and the yield of the organic electro luminescent diode. The entire process yield is greatly restricted by the latter process, that is, the process of forming the organic electro luminescent diode. For example, even though excellent array elements are formed, if foreign particles or other factors cause defects in forming the organic electro luminescent layer using a thin film of about 1000 Å thick, the corresponding OELD is defective. Accordingly, expense and material cost spent in fabricating the non-defective array element occurs, resulting in the reduction of the yield.

SUMMARY OF THE INVENTION

An OELD and a fabrication method thereof enabling its simple and stable operation are provided in which an array element and an organic electro luminescent diode are formed in different substrates, a driving TFT for driving each pixel is a p-Si TFT, a first electrode (anode) of the organic electro luminescent diode is connected to a drain electrode of the driving TFT, and a transparent second electrode (cathode) is unnecessary.

By way of introduction only, in one aspect an organic electro luminescence device includes; first and second electrodes facing each other and spaced from each other by a predetermined interval, an array element formed on the first substrate, the array element including a TFT; an organic electro luminescent diode formed on the second substrate; and a spacer covered with a conductor for electrically connecting a drain electrode of the TFT and a first electrode of the organic electro luminescent diode.

In another aspect, the organic electro luminescence device includes a non-inverted organic electro luminescent diode structure, a transistor, and a conductor that provides contact between a drain of a transistor and a metal. The metal contacts an anode of the organic electro luminescent diode and is the same as the metal that forms a cathode of the organic electro luminescent diode.

In another aspect, a method for fabricating an organic electro luminescence device is provided. The method includes: forming an array element that includes a TFT on a first substrate; forming an organic electro luminescent diode on a second substrate; and electrically connecting a drain electrode of the TFT and a first electrode of the organic electro luminescent diode using spacer covered with a conductor.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts.

Figure 4:
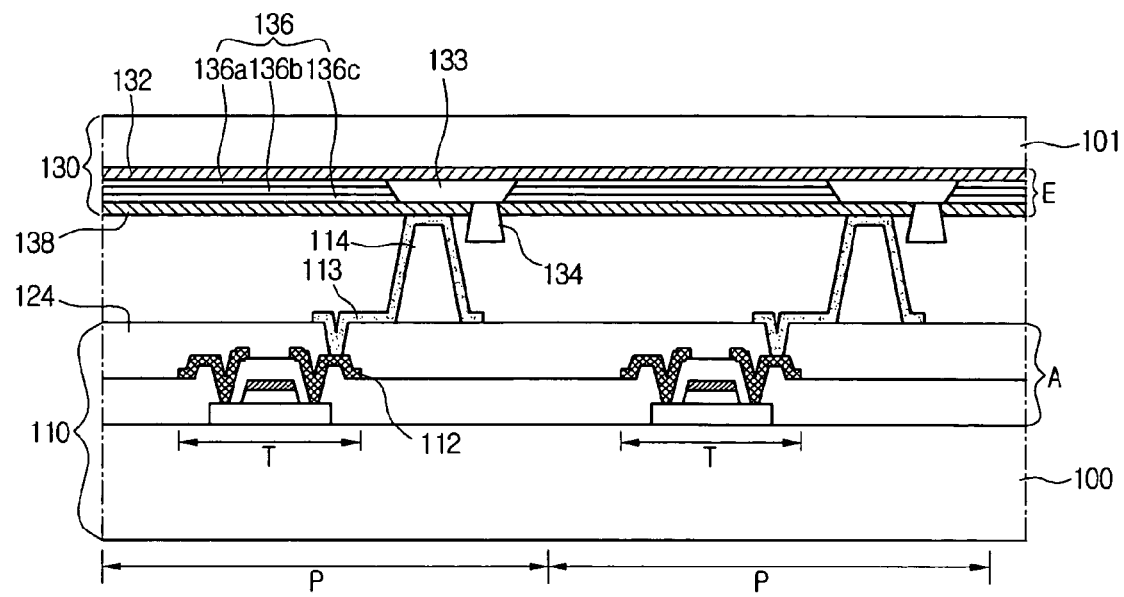
FIG. 4 is a schematic sectional view of a dual panel type OELD.

Before describing the present invention, reference will be made to a dual panel type OELD. FIG. 4 is a schematic sectional view of a dual panel type OELD. For simplicity in description, only two neighboring sub-pixel regions are illustrated in FIG. 4.

Referring to FIG. 4, first and second substrates 110 and 130 are arranged spaced apart from each other by a predetermined interval. An array element A is formed on an upper surface of a transparent substrate 100 of the first substrate 110, and an organic electro luminescent diode E is formed on a lower surface of a transparent substrate 101 of the second substrate 130. Edge portions of the first and second substrates 110 and 130 are encapsulated by a seal pattern (not shown).

The organic electro luminescent diode include a first electrode 132 used as a common electrode, a buffer 133 and a separator 134 that are disposed on a lower surface of the first electrode 132 at a boundary portion between sub-pixels, an organic electro luminescent layer 136 formed on a lower surface of the first electrode 132 within a region corresponding the buffer 133, and a second electrode 138 formed on a lower surface of the organic electro luminescent layer 136 and divided by the separator 134.

The organic electro luminescent layer 136 includes a first carrier transporting layer 136a, an emission layer 136b, and a second carrier transporting layer 136c that are sequentially stacked on the lower surface of the first electrode 132. The first carrier transporting layer 136a and the second carrier transporting layer 136c transport/inject electrons or holes to/into the emission layer 136b.

The first and second carrier transporting layers 136a and 136c are determined depending on an arrangement structure of an anode and a cathode. For example, when the emission layer 136b is made of a polymer and the first and second electrodes 132 and 138 are respectively an anode and a cathode, the first carrier transporting layer 136a connected to the first electrode 132 includes a hole injection layer and a hole transporting layer that are sequentially stacked therein and the second carrier transporting layer 136c connected to the second electrode 138 includes an electron injection layer and an electron transporting layer that are sequentially stacked therein.

The array element A includes a p-Si TFT T. In order to supply a current to the organic electro luminescent diode E, a pole-shaped spacer 114 is disposed per sub-pixel in such a way to connect the second electrode 138 and the TFT T, and a metal portion 113 is formed on an outer surface of the spacer 114 and is electrically connected to a drain electrode 112 of the TFT T.

Unlike a general spacer for an LCD, the spacer 114 mainly aims at connecting the first and second substrates 110 and 130, rather than maintaining a cell gap. The spacer 114 is interposed between the substrates 110 and 130 and has a predetermined height corresponding to an interval between the substrates 110 and 130.

A connecting structure between the spacer 114 and the TFT T will now be described in detail. A protective layer 124 is formed to have a drain contact hole through which the drain electrode 112 is partially exposed to a region covering the TFT T, and the metal portion 113 connected through the drain contact hole to the drain electrode is formed on an upper surface of the protective layer 124 in such a way to cover the spacer 114. Consequently, the TFT T is electrically connected to the organic electro luminescent diode E formed in the second substrate 130.

The TFT T corresponds to a driving p-Si TFT connected to the organic electro luminescent diode E. The metal portion 113 is made of conductive material, preferably ductile metal material having a low resistivity.

The above-constructed dual panel type OELD has a top emission structure in which light is emitted from the organic electro luminescent layer 136 toward the upside of the second substrate 130.

Although not shown in FIG. 4, the array element A further includes a gate line, a data line and a power line that intersect the gate line and are spaced apart from each other by a predetermined interval, a switching TFT disposed at a position where the gate line and the data line intersect each other, and a storage capacitor.

Unlike the existing OELD in which an array element and an organic electro luminescent diode are formed on the same substrate, the dual panel type OELD has a structure in which the array element A and the organic electro luminescent diode E are formed in the different substrates (that is, the first and second electrodes 110 and 130) as described above. Accordingly, compared with the existing OELD, the dual panel type OELD is advantageous in that a yield of the array element A is not affected by the organic electro luminescent diode E.

Also, when a screen is embodied in the top emission type under the above-mentioned structure, the TFT can be designed without consideration of the aperture ratio. Accordingly, the process efficiency of the array element can be improved, and a high aperture ratio and a high resolution can be provided. Also, since the organic electro luminescent diode is formed in the dual panel type, external air can be efficiently isolated and thus the stability of the OELD can be improved.

Also, since the TFT and the organic electro luminescent diode are formed in the different substrates, a sufficient degree of freedom for an arrangement of the TFT can be obtained. Also, since the first electrode of the organic electro luminescent diode is formed on the transparent substrate, a degree of freedom for the first electrode can be increased compared with the existing structure in which a first electrode is formed on an array element.

Figure 1:
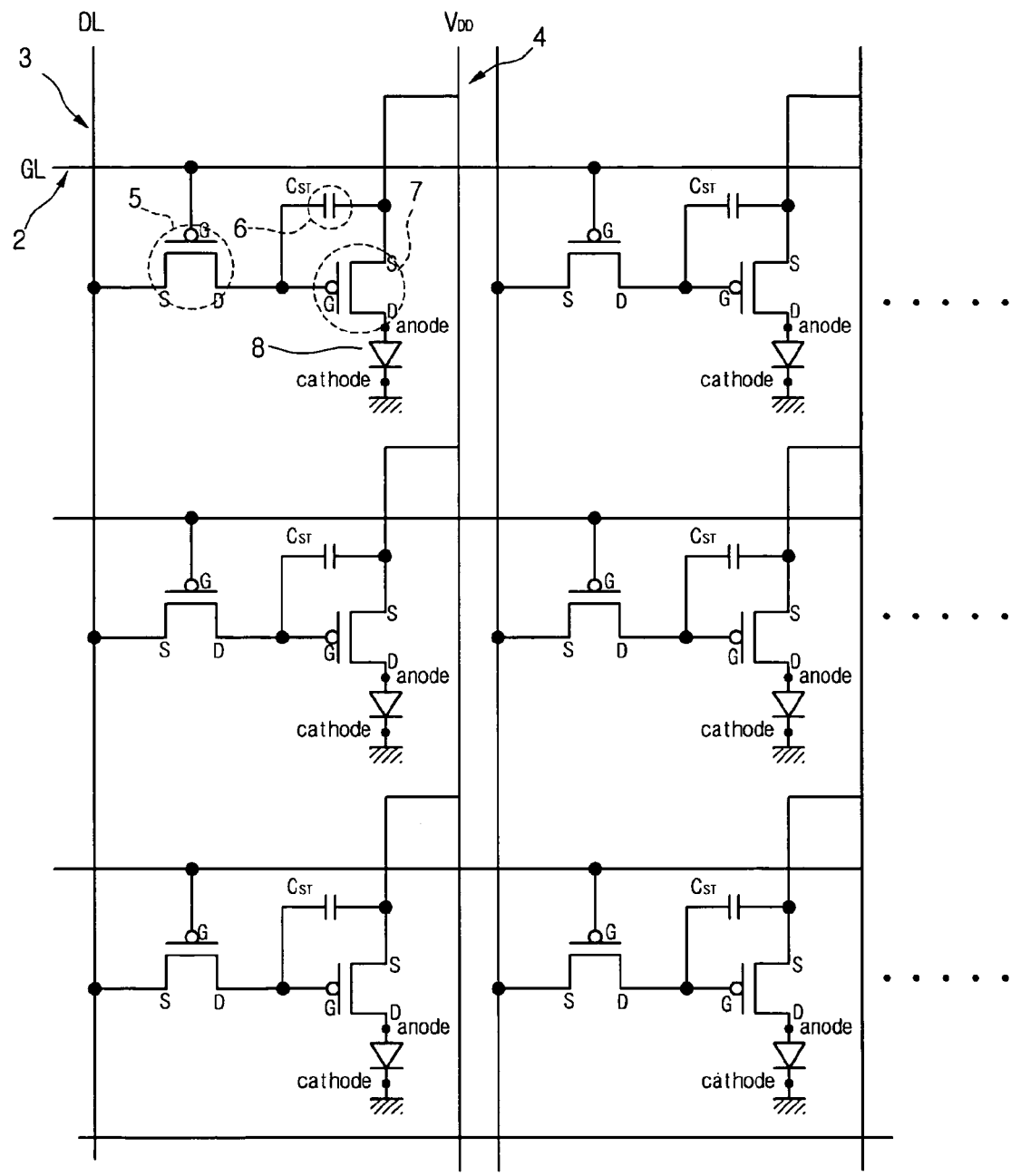
FIG. 1 is a circuit diagram illustrating a basic pixel structure of a related art AMOLED.
Figure 2:
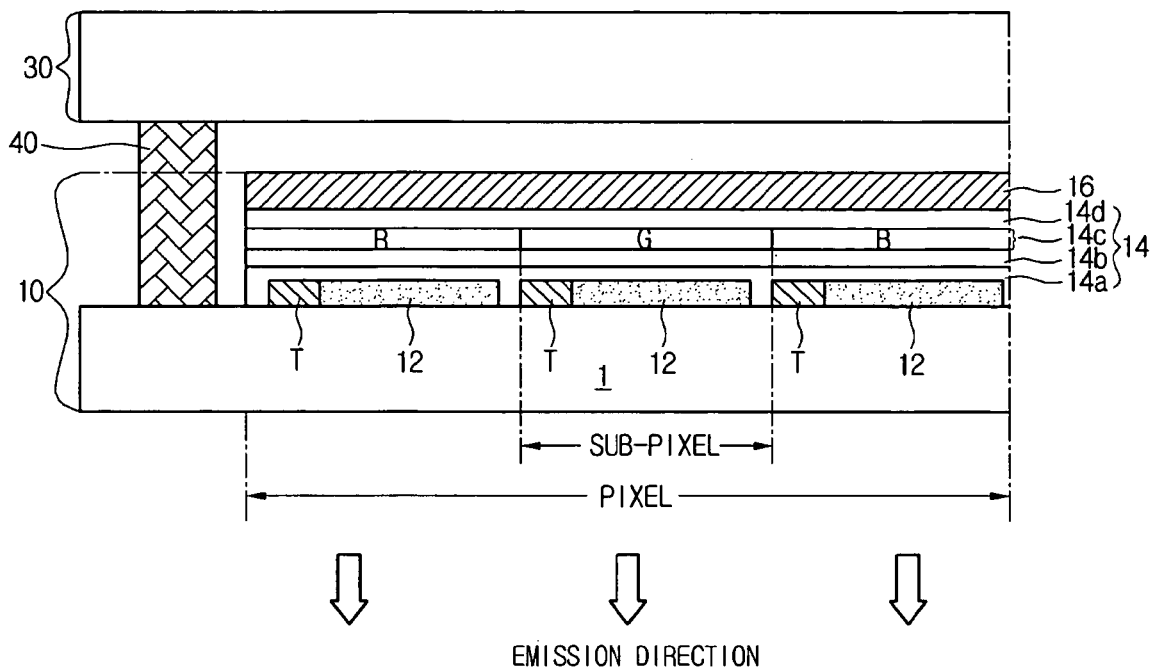
FIG. 2 is a schematic sectional view of a related art bottom emission type AMOLED.
Figure 3:
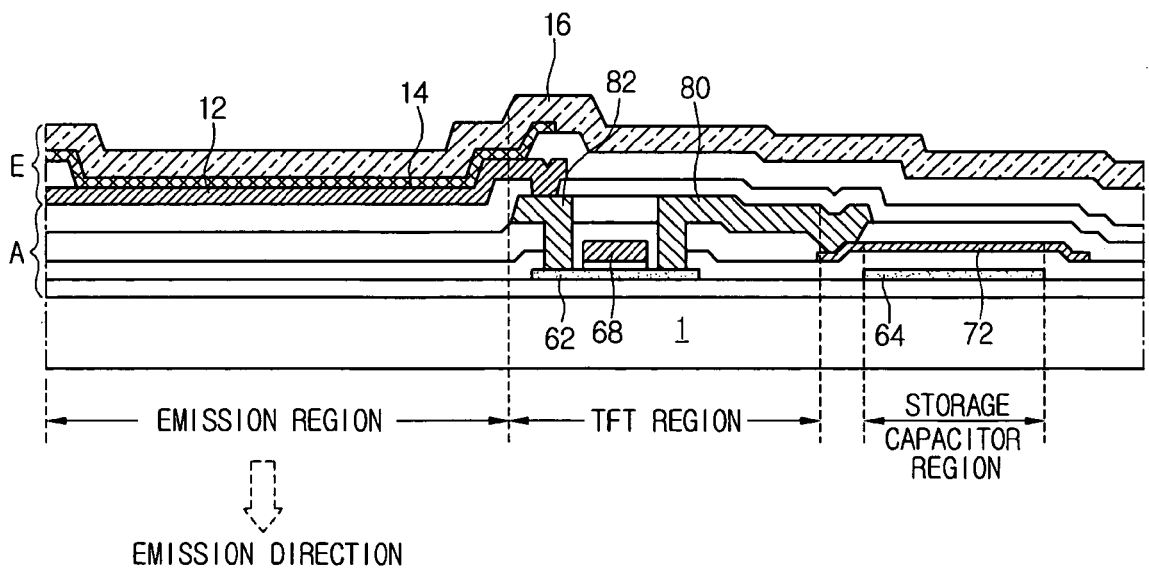
FIG. 3 is an enlarged sectional view of one sub-pixel region of the bottom emission type AMOELD shown in FIG. 2.

However, since the p-Si TFT is generally a p-type TFT as described with reference to FIG. 1, the drain electrode 112 of the driving TFT T is electrically connected to an anode electrode of the organic electro luminescent diode E for stable operation.

Accordingly, when the first electrode 132 is an ITO anode electrode and the second electrode 138 is a cathode electrode made of metal such as Al having a low work function, the drain electrode 112 of the driving TFT T is electrically connected to a cathode of the organic electro luminescent diode E. Consequently, stable operation is difficult.

For solving this problem, a method of using an inverted EL structure is proposed in which the first electrode (anode) 132 and the second electrode (cathode) 138 are exchanged in position. However, in this method a transparent cathode film is used for the top emission structure. Also, when the transparent cathode film is deposited using plasma deposition, the organic electro luminescent layer 136 may be undesirably damaged.

Figure 5:
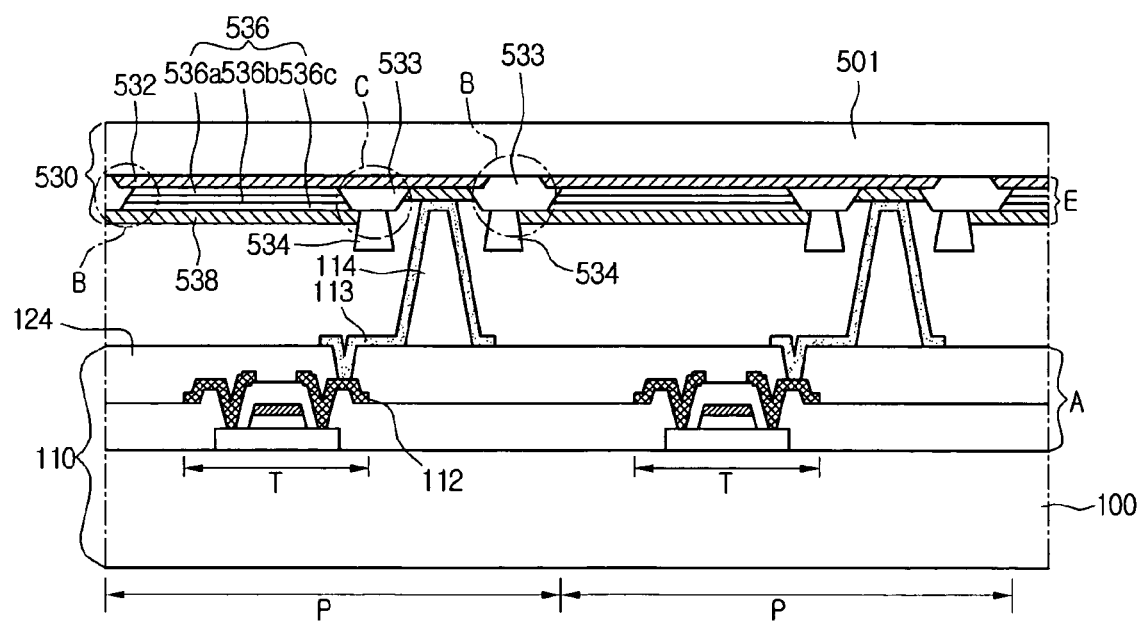
FIG. 5 is a schematic sectional view of an OELD according to an embodiment of the present invention.
Figure 6:
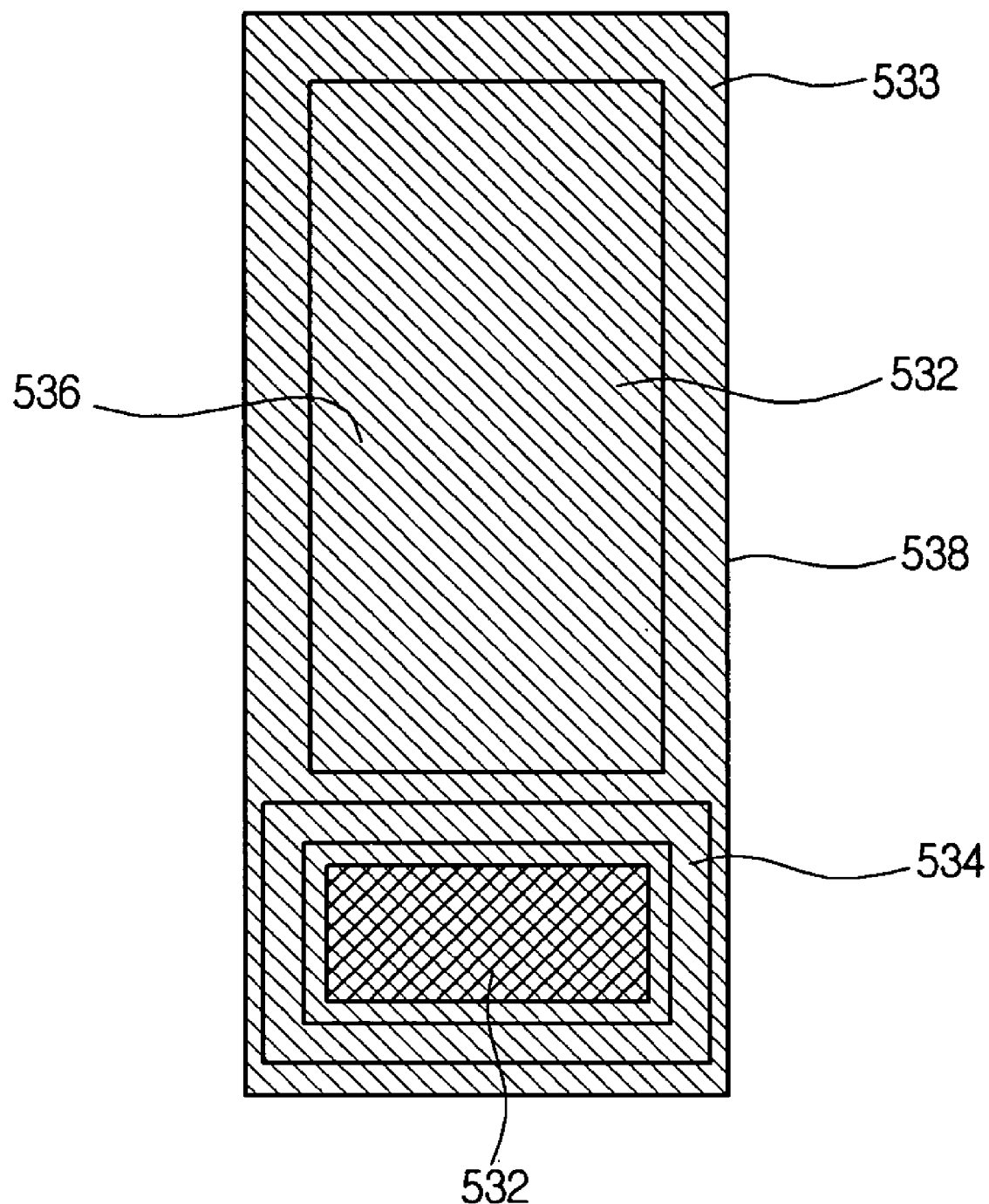
FIG. 6 is a plan view of an upper substrate of the OELD shown in FIG. 5.

FIG. 5 is a schematic sectional view of an OELD according to an embodiment of the present invention. For simplicity in description, only two neighboring sub-pixel regions of the OELD are illustrated in FIG. 5. FIG. 6 is a plan view of an upper substrate of the OELD shown in FIG. 5. For simplicity in description, only one sub-pixel region of the OELD is illustrated in FIG. 6.

The OELD shown in FIG. 5 is similar to the dual panel type OELD shown in FIG. 4, and thus the same reference numbers will be used throughout FIGS. 4 and 5 to refer to the same parts. A first substrate 110 of the OELD has the same structure as the first substrate 110 of the dual panel type OELD shown in FIG. 4. However, a first electrode (anode) 532, a second electrode (cathode) 538, a buffer 533, and a separator 534 are formed in a second substrate 530 differently from those of the second substrate 130 of the dual panel type OELD shown in FIG. 4. In the OELD of FIG. 5, a drain electrode 112 of a p-type driving TFT T provided in the first substrate 110 is electrically connected to an anode (that is, the first electrode 532) of an organic electro luminescent diode E formed in the second substrate 530 and a cathode (that is the second electrode 538) of the organic electro luminescent diode E need not be transparent for the top emission type. That is, a top emission type OELD can be used while stacking the organic electro luminescent diode E in a conventional EL structure rather than in an inverted EL structure.

In the conventional EL structure, the first electrode (anode), a hole injection layer (HIL), a hole transporting layer (HTL), an emission layer (EML), an electron transporting layer (ETL), and the second electrode (cathode) are sequentially stacked on the second substrate. In the inverted EL structure, the second electrode (cathode), an electron transporting layer (ETL), an emission layer (EML), a hole transporting layer (HTL), a hole injection layer (HIL), and the first electrode (anode) are sequentially stacked on the second substrate.

The inverted EL structure is proposed to solve the above-mentioned instability of the OELD, but is problematic in that an interface between the organic luminescent layer and the anode is apt to be damaged and the OELD affected.

For solving these problems, the first electrode (anode) 532 of the organic electro luminescent diode is electrically connected to the drain electrode 112 of the driving TFT T formed in the first substrate 110, while maintaining the conventional EL structure, thereby enabling stable top emission. Here, the driving TFT T is a p-type p-Si TFT.

Referring to FIGS. 5 and 6, the first electrode (anode) 532 of the organic electro luminescent diode E is formed on a lower surface of a transparent substrate 501 of the second substrate 530 per sub-pixel. A buffer 533 is formed in an edge region B of the first electrode 532 and in a given region C on the first electrode 532, that is, an outer region of a portion contacting a spacer 114 covered with a metal portion 113 formed on the first substrate 110. A separator 534 is formed on a lower surface of the buffer 533.

Here, the buffer 533 acts to partition each sub-pixel region and define a region in which an organic electro luminescent layer 536 is formed. That is, the buffer 533 defines each sub-pixel region and the organic electro luminescent layer 536 is formed only in the defined sub-pixel region.

Here, the organic electro luminescent layer 536 is not formed in the sub-pixel's region surrounded by the buffer 533 and the separator 534. The organic electro luminescent layer 536 includes a hole transporting layer 536a, an emission layer 536b, and an electron transporting layer 536c that are sequentially stacked a lower surface of the first electrode 532. The hole transporting layer 536a and the electron transporting layer 536c transport/inject electrons or holes to/into the emission layer 536b. The hole transporting layer 536a connected to the first electrode (anode) 532 includes a hole injection layer and a hole transporting layer that are sequentially stacked therein, and the electron transporting layer 536c connected to the second electrode 538 includes an electron injection layer and an electron transporting layer that are sequentially stacked therein.

The organic electro luminescent layer 536 is formed only in the defined sub-pixel region, and the second electrode (cathode) 538 is formed on a lower surface of the organic electro luminescent layer 536. Here, the second electrode (cathode) 538 acts as a common electrode. The first electrode (anode) 532 is formed in each sub-pixel and acts as a pixel electrode.

Since the organic electro luminescent layer 536 is not formed in the sub-pixel's region surrounded by the buffer 533 and the separator 534, that is, the portion contacting with the spacer 114 covered with the metal portion 113, the first electrode 532 and the second electrode 538 are connected.

An array element A formed in the first substrate 110 includes a p-Si TFT T. In order to supply a current to the organic electro luminescent diode E, a pole-shaped spacer 114 is disposed per sub-pixel to connect the organic electro luminescent diode E and the TFT T, and the metal portion 113 is formed on an outer surface of the spacer 114 and is electrically connected to the drain electrode 112 of the TFT T. That is, the metal portion 113 is formed to cover the spacer 114 and the spacer 114 contacts with the first electrode (anode) 532 through the second electrode (cathode) 538. Consequently, the drain electrode 112 of the TFT T can be electrically connected to the first electrode (anode) 532 of the organic electro luminescent diode E.

Accordingly, the second substrate 530 can be constituted such that the first electrode (anode) 532 of the organic electro luminescent diode is electrically connected to the drain electrode 112 of the driving TFT T formed in the first substrate 110, while maintaining the conventional EL structure, thereby enabling a stable top emission method. Here, the driving TFT T is a p-type p-Si TFT.

Figure 7A:
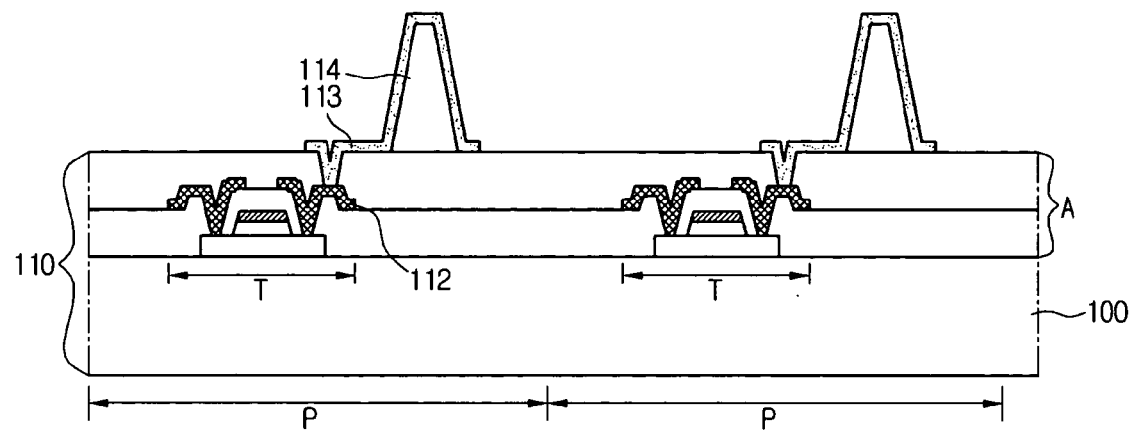
FIGS. 7A to 7F are sectional views illustrating a manufacturing procedure for the OELD shown in FIG. 5.

FIGS. 7A to 7F are sectional views illustrating a manufacturing procedure for the OELD shown in FIG. 5. Referring first to FIG. 7A, the array element A is formed on the first substrate 110 by forming a buffer layer on a transparent substrate, forming a semiconductor layer and a capacitor electrode on the buffer layer, forming a gate electrode and source/drain electrodes (that is, a TFT) on the semiconductor layer, and forming a power electrode connected to the source electrode on the capacitor electrode. A plurality of the TFTs including a driving TFT T may be formed in each sub-pixel, and the TFT may be a p-type p-Si TFT. Thereafter, the spacer 114 covered with the metal portion 113 may be formed as an electrical connection pattern for electrically connecting the first and second substrates.

Figure 7B:
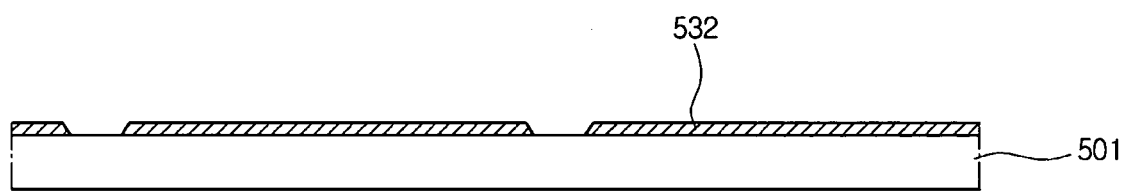

Referring to FIG. 7B, the first electrode (anode) 532 of the organic electro luminescent diode is patterned and formed on the transparent substrate 501 of the second substrate in each sub-pixel. The first electrode 532 is made of transparent conductive material, preferably ITO.

Figure 7C:
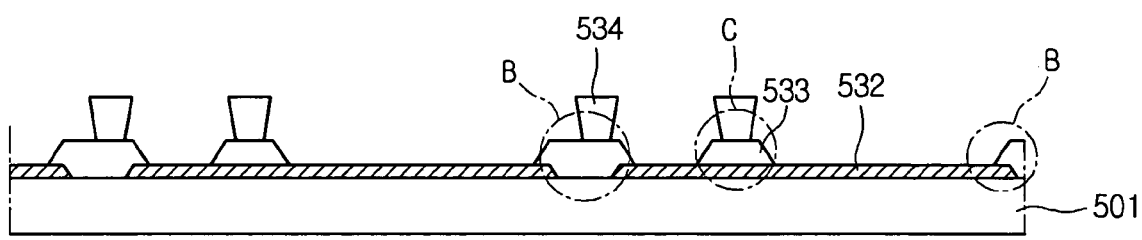

Referring to FIG. 7C, the buffer 533 is formed in the edge region B of the first electrode 532 and the given region C of the first electrode 532, and the separator 534 is formed on the buffer 533. The given region C is an outer region of a portion contacting the spacer 114 covered with the metal portion 113 formed on the first substrate. The buffer 533 and the separator 534 are formed in the given region C. The buffer 533 partitions each sub-pixel region and defines a region in which the organic electro luminescent layer.

Figure 7D:
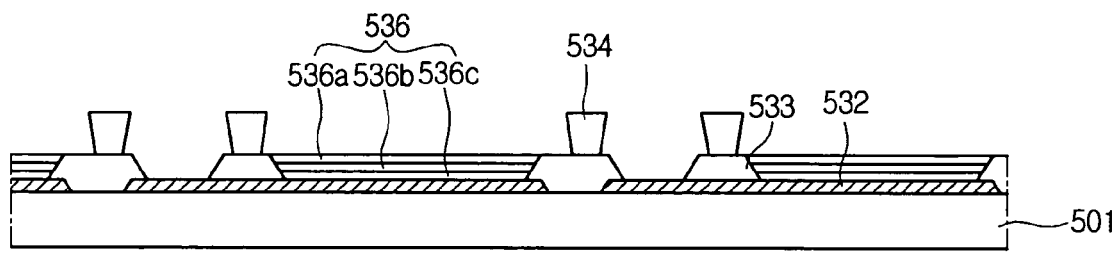

Referring to FIG. 7D, the organic electro luminescent layer 536 is formed only in the sub-pixel's region defined by the buffer 533. The organic electro luminescent layer 536 is not formed in the sub-pixel's region surrounded by the buffer 533 and the separator 534. The organic electro luminescent layer 536 includes a hole transporting layer 536a, an emission layer 536b, and an electron transporting layer 536c that are sequentially stacked a lower surface of the first electrode 532. The hole transporting layer 536a and the electron transporting layer 536c transport/inject electrons or holes to/into the emission layer 536b. The hole transporting layer 536a connected to the first electrode (anode) 532 may include a hole injection layer and a hole transporting layer that are sequentially stacked therein, and the electron transporting layer 536c connected to the second electrode 538 may include an electron injection layer and an electron transporting layer that are sequentially stacked therein.

Figure 7E:
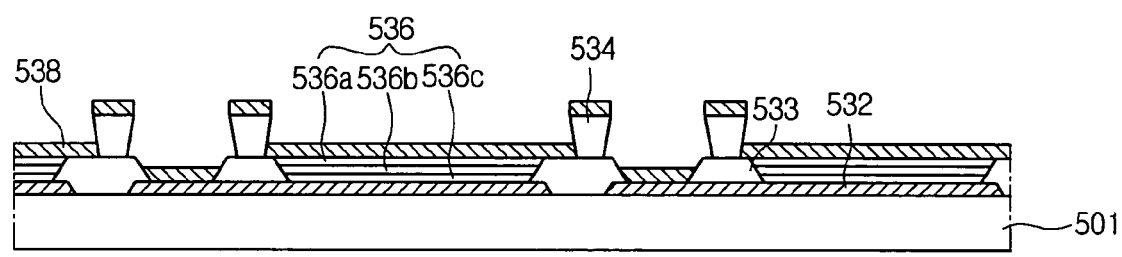

After the organic electro luminescent layer 536 is formed only in the defined sub-pixel region, the second electrode (cathode) 538 of the organic electro luminescent diode is formed on the organic electro luminescent layer 536 as shown in FIG. 7E. The second electrode (cathode) 538 acts as a common electrode, and is preferably formed of metal material having a low working function, such as AL. The first electrode (anode) 532 is formed in each sub-pixel and acts as a pixel electrode. Since the organic electro luminescent layer 536 is not formed in the sub-pixel's region surrounded by the buffer 533 and the separator 534, that is, the portion contacting with the spacer 114 covered with the metal portion 113, the first electrode 532 and the second electrode 538 are connected.

Figure 7F:
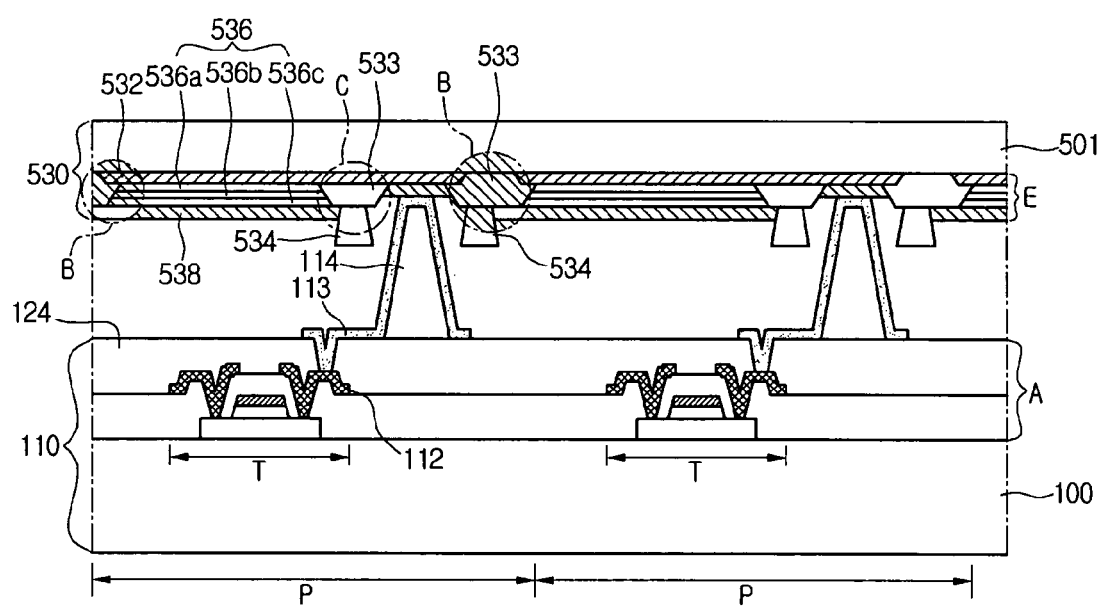

Referring to FIG. 7F, when the first and second substrates are connected together and then encapsulated, the first and second substrates are electrically connected to each other by the spacer 114 covered with the metal portion 113. Consequently, the first electrode (anode) 532 of the organic electro luminescent diode formed in the second substrate is electrically connected to the drain electrode 112 of the TFT formed in the first substrate.

As described above, the OELD and the fabrication method thereof have the following advantages. First, a fabrication yield and efficiency can be improved. Second, due to the top emission method, the TFT can be easily designed and a high aperture ratio and a high resolution are possible. Third, a wide variety of materials can be selected because the organic electro luminescent diode is formed on the substrate. Fourthly, a product stable against external air can be provided because of the top emission method and the encapsulation structure. Also, since the driving TFT is constituted by a p-Si TFT and the first electrode (anode) of the organic electro luminescent diode is connected to the drain electrode of the driving TFT, a transparent second electrode is used and stable operation of the OELD is possible.

It will be apparent to those skilled in the art that various modifications and variations can be made in the present invention. Thus, it is intended that the present invention covers the modifications and variations of this invention provided they come within the scope of the appended claims and their equivalents.

What is claimed is:

1. An organic electro luminescence device comprising:
   first and second substrates facing each other and spaced apart from each other by a predetermined interval;
   an array element formed on the first substrate, the array element including a TFT (thin film transistor), wherein the TFT is a p-type polysilicon driving TFT;
   an organic electro luminescent diode disposed on the second substrate, wherein the organic electro luminescent diode includes a first electrode and a second electrode, the first electrode being disposed closer to the second substrate than the second electrode and being the anode of the organic electroluminescent diode, wherein the first electrode patterned and formed on the second substrate;
   a metal portion contacting directly the first electrode and formed of the same material with the second electrode; and
   a spacer covered with a conductor contacting directly a drain electrode of the TFT and the metal portion.

2. The organic electro luminescence device according to claim 1, wherein the organic electro luminescent diode comprises:
   a buffer and a separator formed in an edge region and a predetermined region on the first electrode, the separator being formed on the buffer;
   an organic electro luminescent layer formed in a region defined by the buffer; and
   the second electrode formed on the organic electro luminescent layer,
   wherein the predetermined region is an outer region of a portion contacted by the conductor,
   wherein the first electrode comprises a transparent material and the second electrode comprises an opaque metal.

3. The organic electro luminescence device according to claim 2, wherein the organic electro luminescent layer is not formed in the predetermined region.

4. The organic electro luminescence device according to claim 1, wherein the spacer is formed from a non-conductive material.

5. The organic electro luminescence device according to claim 1, wherein the first electrode is an anode of the organic electro luminescent diode.

6. The organic electro luminescence device according to claim 1, further comprising a first buffer disposed on the first electrode in a first region adjacent to a second region in which the conductor contacts the metal portion and a second buffer disposed in a third region opposing the first region with the second region therebetween.

7. An organic electro luminescence device comprising a non-inverted organic electro luminescent diode structure, a transistor disposed closer to an anode of the organic electro luminescent diode than a cathode of the organic electro luminescent diode, and a conductor contacting directly a drain of the transistor and a metal, the metal contacting directly the anode of the organic electro luminescent diode, the metal being the same as the metal that forms the cathode of the organic electro luminescent diode.

8. The organic electro luminescence device according to claim 7, wherein the transistor and the organic electro luminescent diode are formed on different substrates.

9. The organic electro luminescence device according to claim 8, wherein the conductor comprises a non-conductive spacer covered with a conductive material.

10. The organic electro luminescence device according to claim 7, further comprising buffers and separators disposed on opposing sides of the conductor.

11. The organic electro luminescence device according to claim 10, wherein the separators define ends of the cathodes of adjacent organic electro luminescent diode.

12. The organic electro luminescence device according to claim 10, wherein one of the buffers defines ends of the anodes of adjacent organic electro luminescent diode.

13. The organic electro luminescence device according to claim 7, further comprising a plurality of sub-pixels, each sub-pixel comprising an organic electro luminescent diode, a transistor, and a conductor, the anode of each organic electro luminescent diode not overlapping the cathode of the adjacent organic electro luminescent diode.

14. A method for fabricating an organic electro luminescence device, the method comprising:
   forming an array element on a first substrate, the array element including a TFT, wherein the TFT is a p-type polysilicon driving TFT;
   forming an organic electro luminescent diode on a second substrate, wherein the organic electro luminescent diode includes a first electrode and a second electrode, the first electrode being disposed closer to the second substrate than the second electrode;
   forming a spacer covered with a conductor on the first substrate; and
   electrically connecting a drain electrode of the TFT and the first electrode of the organic electro luminescent diode using the conductor, the conductor contacting directly the drain electrode and a metal portion, the metal portion contacting directly the first electrode and formed of the same material with the second electrode.

15. The method according to claim 14, wherein forming the organic electro luminescent diode comprises:
   patterning and forming the first electrode on the second substrate;

forming a buffer in an edge region and a predetermined region on the first electrode and forming a separator on the buffer;

forming an organic electro luminescent layer in a region defined by the buffer; and forming the second electrode on the organic electro luminescent layer, wherein the first electrode and the metal portion contact each other in the predetermined region.

16. The method according to claim 15, wherein the predetermined region is an outer region of a portion contacted by the spacer covered with the conductor.

17. The method according to claim 15, wherein the organic electro luminescent layer is not formed in the predetermined region.

18. The method according to claim 15, wherein the first electrode and the metal portion contact each other in the predetermined region.

19. The method according to claim 14, wherein forming the array element on the first substrate comprises:

forming the spacer at a position where the organic electro luminescent diode and the TFT are connected; and forming the conductor on an outer surface of the spacer.

20. The method according to claim 14, wherein the spacer covered with the conductor electrically connects the drain electrode of the TFT and the first electrode of the organic electro luminescent diode through the metal portion.

* * * * *